(12) United States Patent
Lautzenhiser et al.

(10) Patent No.: US 6,690,238 B2
(45) Date of Patent: Feb. 10, 2004

(54) VARIABLE PHASE-SHIFTING RF POWER AMPLIFIERS

(75) Inventors: Lloyd L. Lautzenhiser, Sun Valley, NV (US); Barry A. Lautzenhiser, Carson City, NV (US)

(73) Assignee: Emhiser Research, Inc., Verdi, NV (US)

( * ) Notice: Subject to any disclaimer, the term of this patent is extended or adjusted under 35 U.S.C. 154(b) by 36 days.

(21) Appl. No.: 10/091,056

(22) Filed: Mar. 4, 2002

(65) Prior Publication Data

US 2002/0118066 A1 Aug. 29, 2002

Related U.S. Application Data

(63) Continuation-in-part of application No. 10/028,844, filed on Dec. 20, 2001.
(60) Provisional application No. 60/258,341, filed on Dec. 27, 2000.

(51) Int. Cl.[7] .................................................. H03F 3/68
(52) U.S. Cl. ..................... 330/295; 330/124 R; 330/286
(58) Field of Search ................................. 330/295, 286, 330/124 R; 375/308, 309; 332/103, 105

(56) References Cited

U.S. PATENT DOCUMENTS

| 4,549,152 A | * | 10/1985 | Kumar | 332/23 R |
|---|---|---|---|---|
| 4,631,493 A | * | 12/1986 | Vendelin et al. | 330/277 |
| 5,256,987 A | * | 10/1993 | Kibayashi et al. | 330/295 |
| 5,606,283 A | * | 2/1997 | Allen et al. | 330/124 R |
| 6,163,220 A | * | 12/2000 | Schellenberg | 330/295 |

* cited by examiner

Primary Examiner—Henry Choe
(74) Attorney, Agent, or Firm—Wendell E. Miller

(57) ABSTRACT

Variable phase-shifting rf power amplifiers (10, 30, 50) shift rf outputs at any angle up to 90, 180, or 270 degrees, respectively, while maintaining an rf output substantially constant. The variable phase-shifting rf power amplifiers (10, 30, 50) include two to four field-effect transistors (Q1, Q2, Q3, Q4) that are interposed between phase splitters and combiners, and that are connected in series between a source voltage and a lower voltage. Phase shifting is achieved by selectively and variably controlling amplification of the field-effect transistors (Q1, Q2, Q3, Q4). Selective and variable control of amplification is achieved by separately and variably controlling gate voltages of the field-effect transistors (Q1, Q2, Q3, Q4), whereby a difference between the source voltage and the lower voltage is used selectively by one of the field-effect transistors (Q1, Q2, Q3, Q4) and selectively proportioned between two of the field-effect transistors (Q1, Q2, Q3, Q4). Phase controls (34, 54) generate separate and variable phase-shifting voltages, or gate voltages, in response to a variable phase-shifting voltage.

35 Claims, 4 Drawing Sheets

US 6,690,238 B2

VARIABLE PHASE-SHIFTING RF POWER AMPLIFIERS

CROSS-REFERENCES TO RELATED APPLICATIONS

This patent application is a Continuation-in-part of U.S. patent application Ser. No. 10/028,844, filed Dec. 20, 2001 which claims priority to Provisional Patent Application Ser. No. 60/258,341, filed Dec. 27, 2000.

STATEMENT RE FEDERALLY SPONSORED RESEARCH OR DEVELOPMENT

Not Applicable

REFERENCE TO SEQUENCE LISTING

Not Applicable

BACKGROUND OF THE INVENTION

1. Field of the Invention

The present invention relates generally to apparatus and method for power amplifying radio frequency (rf) or microwave rf signals. More particularly, the present invention pertains to an rf power amplifier in which the rf output is selectively phase shifted at angles up to, and beyond, 270 degrees in response to a variable phase-control voltage, or is binary-phase-shift-key modulated in response to digital inputs of zero and one.

2. Description of Related Art

Binary-phase-shift-key (BPSK) modulation is a form of digital modulation in which the rf carrier is phase shifted 180 degrees (inverted) as a digital input changes from 0 to 1. A demodulator, that is a part of an rf receiver, demodulates these phase inversions to recover the original digital stream. Commonly, demodulation is accomplished by a Costas Loop.

A common encoder consists of the rf carrier being inserted into an rf input port of a mixer while a digital input is inserted into an input port of a local oscillator. As the digital input into the input port of the local oscillator changes from an above ground voltage (1) to below ground (0), the output of the mixer changes phase from 0 degrees to 180 degrees.

If the input to the local oscillator were to change polarity (0 to 1, or 0) instantaneously, the phase of the rf output would also change polarity instantaneously. This would cause the output rf spectrum to spread to an unacceptable width.

To prevent this spread in the rf output spectrum (spectrum splatter), commonly, the input to the local oscillator port is filtered (usually with a Bessel filter. As a result, the rf output decreases as the voltage to the input port of the local oscillator is decreased, and the rf output decreases to 0 when the input to the local oscillator passes through 0.0 volts. Then the rf output increases in amplitude (with inverted phase) as the voltage to the local oscillator input increases to the opposite extreme.

Therefore, as the filtered input passes through 0 volts as the polarity changes, the rf output also passes through a 0 rf output condition. This creates a problem in that the rf power amplifier section stages of conventional transmitters consists of several stages biased to Class C. In a Class C amplifier, a 0 rf input signal causes the amplifier to shut off. If a Class C amplifier were to follow the above-described encoder, it would shut off every time the input data changes state. This turning off and on of the Class C stages would cause the rf output to occupy far more of the frequency spectrum than allowed by federal regulations.

The present invention solves the above-mentioned problems with phase-shifting in general, and binary-phase-shift-key (BPSK) modulation in particular, in that the rf output stays relatively constant as the phase shifts. In one embodiment the phase shifts up to 180 degrees generally linear with a variable phase-control voltage, or shifts 180 degrees in response to a filtered BPSK input.

More particularly, the phase shifts from 0 to 90 degrees in response to a phase-control voltage increasing from 0.0 volts dc to 5.0 volts dc during which time the rf output remains substantially constant; and the rf output continues to be relatively constant as the phase shifts from 90 degrees to 180 degrees as the filtered BPSK input increases from 5.0 volts dc to 10.0 volts dc.

Since the rf output remains substantially constant during changes in the phase angle, turning off and on of Class C stages following the encoder is avoided, frequency splatter is avoided, and the occupied frequency spectrum of the rf output follows theoretical values more closely.

The present invention utilizes solid-state amplifying devices, preferably FETs in a totem-pole arrangement. As taught by Lautzenhiser et al. in U.S. patent application Ser. No. 10/028,844, filed Dec. 20, 2001, which is incorporated herein by reference thereto, two or more solid-state devices, or FETs, can be series connected, in a totem-pole arrangement, to dividingly share a source-voltage that is too high for a single solid-state amplifying device, or FET.

In the present invention, two or more solid-state amplifying devices, or FETs, are connected in series in a totem-pole arrangement, and they dividingly share, or selectably utilize, the source-voltage. That is, to phase shift the rf output to some angles the entire source-voltage is utilized by a selected one of the solid-state amplifying devices, or FETs, and to phase shift the rf output to other phase angles the source-voltage is dividingly shared by two adjacent ones of the solid-state amplifying devices.

Therefore, source-voltage sharing in the present invention is for an entirely different purpose, and functions entirely different, than that of the aforementioned Lautzenhiser et al. patent application. However, the two inventions share a common problem. Unless proper rf decoupling is achieved, the maximum rf power output is extremely limited.

More particularly, totem-pole arrangement of solid-state amplifying devices was taught in a paper published in *IEEE Transactions on Microwave Theory and Techniques,* Volume 46, Number 12, of December 1998, in an article entitled, "*A 44-Ghz High IP3 InP-HBT Amplifier with Practical Current Reuse Biasing.*" As taught in the IEEE article, in totem-pole circuits two, or more, solid-state amplifying devices are used in series for dc operation, but they are used in parallel for rf operation, thereby supposedly solving the disparity between source-voltages and working voltages.

However, totem-pole, voltage-dividing, or current-sharing circuits, had been used only at low rf powers, as in the above-referenced article wherein the power was in the order of 10 milliWatts. At higher rf powers, inadequate rf decoupling has resulted in low power efficiency, oscillation, a decrease in reliability of the circuits, and destruction of the solid-state amplifying devices.

In contrast, to the extremely low rf outputs in which the prior art has been able to utilize totem-pole circuity, Lautzenhiser et al., in the aforementioned patent application, teach apparatus and method for rf decoupling in which the principles thereof may be used to make totem-pole circuits that are limited only by power limitations of the solid-state amplifying devices that are used in the totem pole.

More particularly, in totem-pole circuits, problems with rf decoupling are most severe between the solid-state amplifying devices. For instance, when using FETs, rf decoupling is the most critical with regard to a source terminal of any FET that is connected to a drain terminal of a next-lower FET. Capacitors and rf chokes are used for rf decoupling and rf isolating, but selection and design of capacitor decoupling is the most critical.

The next most critical location for rf decoupling is the source terminal of the lower FET when the source terminal of the lower FET is connected to an electrical ground through a resistor, as shown herein. However, if a negative bias voltage is used for the gate of the lower FET, and the source is connected directly to an electrical ground, this source terminal is already rf decoupled.

Other critical rf decoupling problems are those associated with the source-voltage to the drain of the upper FET and bias voltages to the gates of the FETs. The use of properly designed rf chokes are sufficient to provide adequate rf decoupling in these locations.

Unless rf decoupling is provided, as taught by Lautzenhiser et al. in the above-referenced patent application, reduced efficiency will certainly occur, and both instability and destruction of the solid-state amplifying devices are likely. This is true for both totem-pole circuitry in which a source-voltage that is excessive for a single solid-state amplifying device is dividingly shared, and for phase-shifting as taught in the present invention.

BRIEF SUMMARY OF THE INVENTION

The present invention provides variable phase-shifting rf power amplifiers in which, in various embodiments taught herein, the rf output can be selectively shifted up to 90 degrees, up to 180 degrees, or up to 270 degrees in response to variable or preselected phase-control voltages. The resultant rf output is phase shifted without appreciably affecting the rf output power during phase-shifting, while remaining at any phase-shifted angle, or even when the rf output is digital-phase-shift-key (DPSK) modulated.

Each of the variable phase-shifting rf power amplifiers of the present invention includes a phase splitting/combining rf power amplifier and a phase control. The phase splitting/combining rf power amplifier includes 2, 3, or 4, solid-state amplifying devices, preferably FETs, for phase-shifting up to 90, 180, or 270 degrees, respectively.

The solid-state amplifying devices (FETs) in the phase splitting/combining rf power amplifier are controlled by 1, 2, or 3 phase-shifting voltages. That is, for 180 degree phase-shifting, three solid-state amplifying devices are required, and two phase-shifting voltages are required. The phase controls of the present invention generate the phase-shifting voltages in response to a single phase-control voltage. However, for 90 degree phase-shifting, only one phase-shifting voltage is needed, so the phase angle increases in response to, and substantially linear to, a phase-control voltage.

In the phase splitting/combining rf power amplifiers of the present invention, an rf input is phase split into 2, 3, or 4 rf signals. The phase-split rf signals are selectively amplified in response to phase-shifting voltages. Then the phase-split rf signals, that have been selectively amplified, are combined to provide an rf output signal whose power remains substantially constant during phase shifts up to 90 degrees, 180 degrees, 270 degrees, or more.

Phase splitting is accomplished by such devices as quadrature power splitters, or by a combination of 180 degree and 90 degree power splitters. Preferably, power combining is accomplished by one or more in-phase power combiners.

Preferably, the solid-state amplifying devices are connected in totem-pole arrangement with the solid-state amplifying devices selectively and dividingly sharing the source-voltage. Therefore, rf decoupling is critical and is accomplished as taught by Lautzenhiser et al. in the above-referenced patent application.

Finally, as taught by Lautzenhiser et al. in the above-referenced patent application, in designs in which the source terminal is the mounting flange of a packaged FET, as is common in high-power solid-state amplifying rf power devices, a mounting technique is used that avoids both over heating and the resultant danger of destroying the internal junctions of the solid-state amplifying device, while maintaining electrical isolation from a circuit ground.

In a first aspect of the present invention, a method for phase-shifting an rf output comprises: phase-splitting an rf input into a plurality of rf signals that are at different phase angles; amplifying a selected one of the rf signals; simultaneously amplifying an other of the rf signals; inversely controlling gains of the amplifying steps; and combining the rf signals into the rf output subsequent to the amplifying steps.

In a second aspect of the present invention, a method for phase-shifting an rf output comprises: splitting an rf input into first and second rf signals that are at different phase angles; inputting the first rf signal into a first solid-state amplifying device; inputting the second rf signal into a second solid-state amplifying device; amplifying the first and second rf signals with selective and different gains; and combining the rf signals subsequent to the amplifying step.

In a third aspect of the present invention, a method for binary-phase-shift-key modulating comprises: splitting an rf output into 0, 90, and 180 degree rf signals; separately amplifying the rf signals; combining the separately amplified rf signals into a single rf output; and preventing the single rf output from decreasing to 0 degrees when the rf output is phase-shifted 180 degrees.

In a fourth aspect of the present invention, an rf power amplifier comprises: a first solid-state amplifying device having a first higher-voltage terminal that is connected to a higher-voltage, having a first lower-voltage terminal, and having a first control-voltage terminal; an rf choke being connected to the first lower-voltage terminal; a second solid-state amplifying device having a second higher-voltage terminal that is connected to the rf choke distal from the connection thereof to the first lower-voltage terminal, having a second lower-voltage terminal that is connected to a lower voltage, and having a second control-voltage terminal; means, being connected between the first lower-voltage terminal and an electrical ground, for decoupling the first and second solid-state amplifying devices; and the means for decoupling comprises an rf effective series resistance of less than 0.4 divided by an rf output, in Watts, of the rf power amplifier.

In a fifth aspect of the present invention, a method comprises: phase-splitting an rf input into a plurality of rf signals whose phase angles encompass first and second phase angles; separately and simultaneously amplifying the rf signals; selectively proportioning gains of the amplifying steps; combining the separately and simultaneously amplified rf signals into a single rf output; and phase-shifting the rf output to selected phase angles between the first and second phase angles as a function of the selective proportioning step.

DETAILED DESCRIPTION OF THE INVENTION

Figure 1:
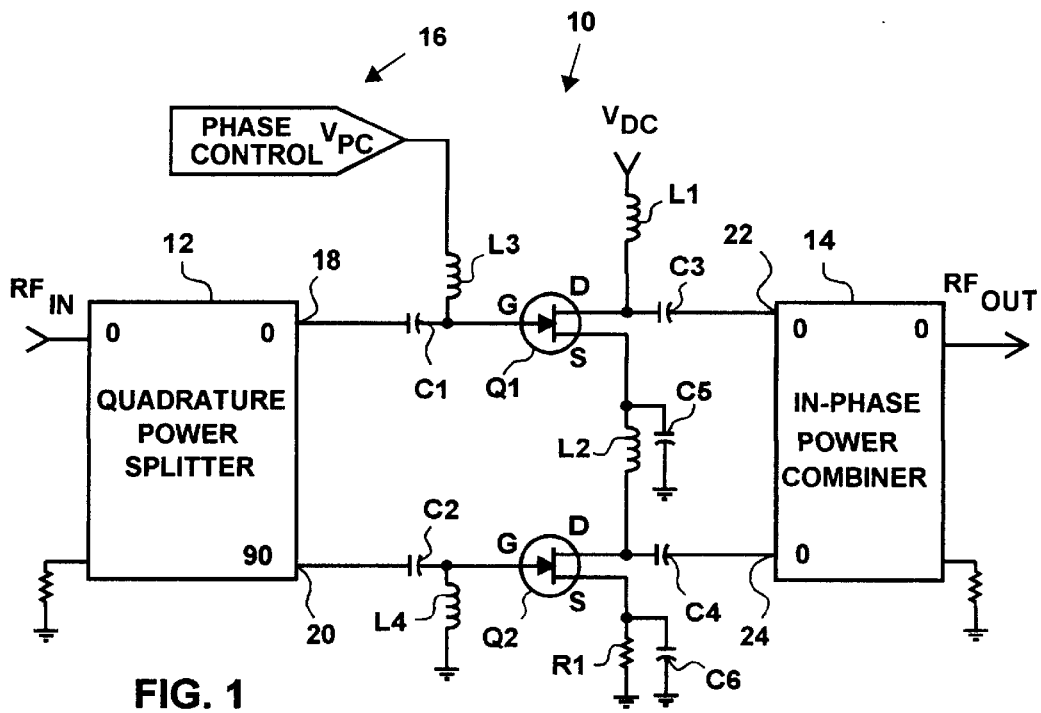
FIG. 1 is a variable phase-shifting rf power amplifier of the present invention in which two, n-channel, gallium arsenide FETs are stacked to selectively utilize a source-voltage, and in which an rf output can be shifted up to 90 degrees proportional to, and substantially linearly with, a single phase-control voltage.

Referring now to FIG. 1, a variable phase-shifting rf power amplifier 10 includes solid-state amplifying devices, field-effect transistors, or FETs, Q1 and Q2 that are connected in series between a higher-voltage, or source-voltage VDC and a lower voltage or a ground. That is, a first rf choke L1 connects the source-voltage VDC to a drain terminal of the FET Q1, a second rf choke L2 connects a source terminal of the FET Q1 to a drain terminal of the FET Q2, and a resistor R1 connects a source terminal of the FET Q2 to a ground.

The variable phase-shifting rf power amplifier 10 also includes an rf quadrature power splitter 12 and an rf in-phase power combiner 14. The quadrature power splitter 12 is connected to gate terminals of the FETs Q1 and Q2, respectively, by coupling capacitors C1 and C2. The rf power combiner 14 is connected to drain terminals of the FETs Q1 and Q2, respectively, by coupling capacitors C3 and C4. And source terminals of the FETs Q1 and Q2 are connected to an electrical ground by decoupling capacitors C5 and C6, respectively.

A phase control 16 provides a phase-shifting voltage $V_{PS}$ in response to a phase-control voltage $V_{PC}$, and supplies the phase-shifting voltage $V_{PS}$ to the gate terminal of the FET Q1 through a third rf choke L3 as a variable bias voltage. The resistor R1 supplies a negative gate-to-source bias for the gate terminal of the FET Q2 through a fourth rf choke L4. The resistor R1, in setting the gate-to-source bias for the FET Q2, controls current flow through the FETs, Q1 and Q2, thereby controlling rf power amplification of the variable phase-shifting rf power amplifier 10.

Figure 10:
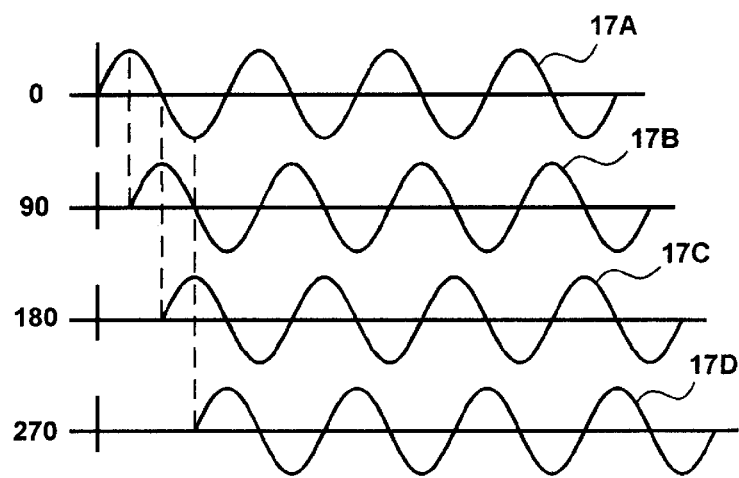
FIG. 10 illustrates sine waves of four phase-split rf signals that are phase-shifted, respectively, by 0, 90, 180, and 270 degrees.

In operation, an rf input signal $RF_{IN}$ of the variable phase-shifting rf power amplifier 10 is phase split in the rf power splitter 12, into rf signals 17A and 17B that are phase-shifted by 0 and 90 degrees, respectively, as shown in FIGS. 1 and 10. The rf signals 17A and 17B are amplified in the FETs Q1 and Q2 in selected proportions, and are combined in the rf power combiner 14 to provide a power amplified output at an rf output terminal $RF_{OUT}$ that is selectively phase-shifted.

The amplifying function of the FETs Q1 and Q2 is maintained by using rf chokes L1, L2, L3, and L4, to keep the rf signal from coupling onto the dc bias lines and to prevent rf interference between FETs Q1 and Q2; and decoupling capacitors, C5 and C6, are used to keep the source terminals of both FETs, Q1 and Q2, at an rf ground.

As taught by Lautzenhiser et al. in the aforementioned patent application, the performance of rf power amplifiers that series connect FETs, or other solid-state amplifying devices, rests heavily on correct design and application of rf chokes, such as the rf chokes L1, L2, L3, and L4 of FIG. 1, and decoupling capacitors, such as the decoupling capacitors C5 and C6 of FIG. 1. Therefore, rf choke and decoupling capacitor design will be considered in greater detail after considering various other embodiments of the present invention.

The voltage to the drain terminal D of the upper FET Q1 cannot exceed the specified FET drain-to-source voltage (Vds). Or, if the FET Q1 were replaced by a bipolar transistor, not shown, the collector-to-emitter voltage (Vce) could not exceed specifications. Therefore, in the case of GaAsFETs the source-voltage should be 12 volts dc (Vds+ Vpinchoff of the lower FET Q2).

In operation, if the phase-shifting voltage, $V_{PS}$ is lowered to 0.0 volts dc by the phase control 16, 10.0 volts dc will be applied across the FET Q1, and 0.0 volts dc will be applied across the FET Q2. Since the gain of FETs, such as the FETs Q1 and Q2, is approximately a linear function of the drain-to-source voltage, an rf output of the FET Q1 will be at maximum gain while an rf output of the FET Q2 will be at minimum gain.

At this time, the rf in-phase power combiner 14 will output half of the rf power to the rf output terminal $RF_{OUT}$ and half of the rf power to the internal or external load. More importantly, the half delivered to rf output terminal $RF_{OUT}$ will be in-phase with a first rf signal at an upper rf output terminal 18 of the quadrature power splitter 12, that is disregarding inversion of the FET Q1.

If the phase-shifting voltage is now raised to 10.0 volts dc by the phase control 16, 0.0 volts dc will be applied across the FET Q1, and 10.0 volts dc will be applied across the FET Q2. The FET Q1 will now be at a minimum gain while the FET Q2 will be at maximum gain. In this case, the output of the in-phase rf power combiner 14 will be in-phase with a second rf signal at a lower rf output terminal 20 of the quadrature power splitter 12. That is, the phase will have been shifted 90 degrees. Again, half of the power is delivered to the rf output terminal $RF_{OUT}$ and half is delivered to the internal or external load.

If the phase-shifting voltage is set to 5.0 volts dc by the phase control 16, 5.0 volts dc will be applied across both the FET Q1 and the FET Q2, and both FETs will operate at half gain. In this case, an upper rf input terminal 22 and a lower rf input terminal 24 to the rf in-phase power combiner 14 will be equal in amplitude but 90 degrees out of phase.

At this time, the rf output terminal $RF_{OUT}$ of the rf in-phase power combiner 14 remains at half power but is 45 degrees out of phase with the upper rf input terminal 22. As before, half of the power will be delivered to the internal or external load.

Thus, it can be seen that phase control 16 is effective to shift the phase of the variable phase-shifting rf power amplifier 10 monotonically, and with reasonable linearly, from 0 to 90 degrees as the phase-control voltage is varied from 0.0 volts dc to 10.0 volts dc.

Finally with regard to FIG. 1, alternately, instead of the quadrature power splitter 12 and the rf in-phase power combiner 14, an in-phase splitter and a quadrature combiner may be used.

Figure 2:
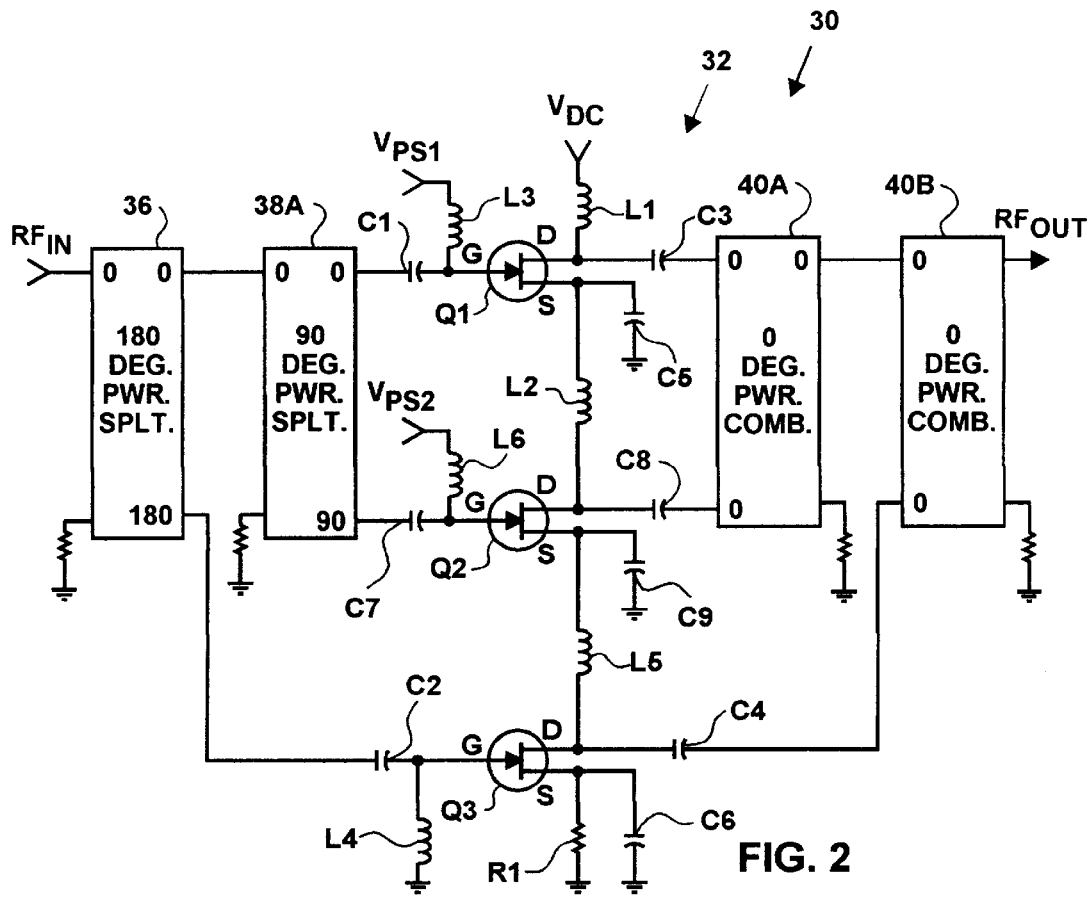
FIG. 2 is a phase splitting/combining rf power amplifier, in which three FETs are stacked to selectively utilize a source-voltage, that when combined with a phase control of FIG. 3, becomes a variable phase-shifting rf power amplifier in which a phase angle of an rf output can be shifted up to 180 degrees in response to two phase-shifting voltages.
Figure 3:
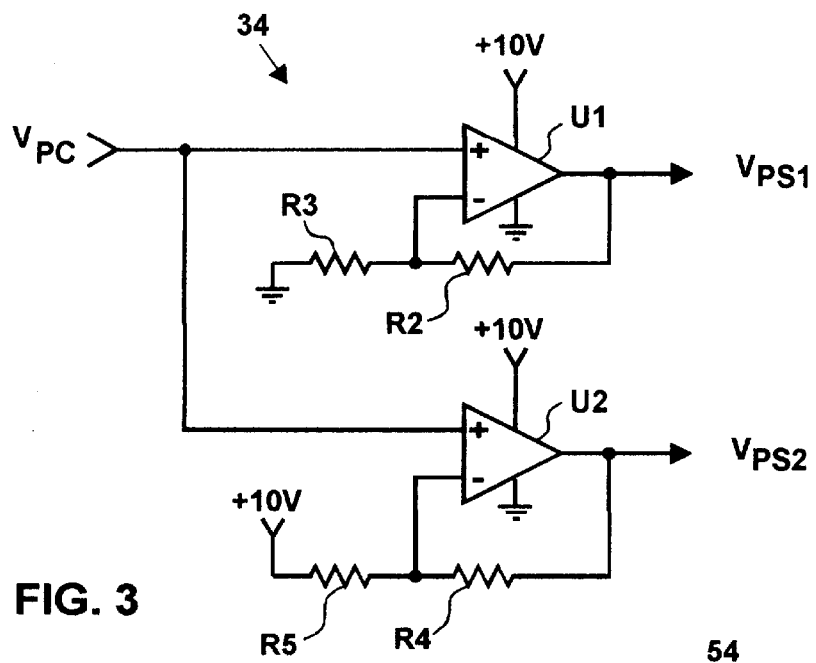
FIG. 3 is a phase control, that generates two phase-shifting voltages in response to a variable phase-control voltage, and that when combined with the phase splitter/combiner rf power amplifier of FIG. 2, becomes a variable phase-shifting rf power amplifier in which the rf output can be phase shifted up to 180 degrees substantially linear with a phase-control voltage.

Referring now to FIGS. 2 and 3, a variable phase-shifting rf power amplifier 30 includes both a phase splitting/combining rf power amplifier 32 of FIG. 2 and a phase control 34 of FIG. 3. The variable phase-shifting rf power amplifier 30 has a phase-shift range of 180 degrees, which is twice that of the variable phase-shifting rf power amplifier 10 of FIG. 1.

The phase splitting/combining rf power amplifier 32 of FIG. 2 includes a 180 degree power splitter 36, a 90 degree power splitter 38A, input terminals that shift an rf output in response to phase-shifting voltages, $V_{PS1}$ and $V_{PS2}$, solid-state amplifying devices, field-effect transistors, or FETs, Q1, Q2, and Q3, and 0 degree power combiners, 40A and 40B.

As shown in FIG. 2, the 180 degree power splitter phase splits the rf input $RF_{IN}$ into 0 and 180 degree rf signals, and the 90 degree power splitter 38A, which is connected to the 0 degree phase-angle output of the 180 degree power splitter 36, splits its output into 0 and 90 degree rf signals, so that 0, 90, and 180 degree phase-shifted rf signals are provided, as also illustrated in FIG. 10 by 0, 90, and 180 degree phase-shifted rf signals, 17A, 17B, and 17C, respectively.

Also, the phase splitting/combining rf power amplifier 32 includes coupling capacitors C1, C2, C3, and C4, decoupling capacitors C5 and C6, rf chokes L1, L2, L3, and L4, and a resistor R1 as shown in FIG. 1. In addition, the phase splitting/combining rf power amplifier 32 includes coupling capacitors C7 and C8, decoupling capacitor C9, and rf chokes L5 and L6.

If phase-shifting voltages, $V_{PS1}$ and $V_{PS2}$ are at 0.0 volts dc, 10.0 volts dc will be applied across the FET Q1 and 0.0 volts dc will be applied across the FETs Q2 and Q3. At this time, since the gain of the FETs Q1, Q2, and Q3 is approximately a linear function of the applied voltage from drain to source, the FET Q1 will be at maximum gain while the FETs Q2 and Q3 will be at minimum gain, and the rf output ($RF_{OUT}$) will be at 0 degrees relative to the rf input signal ($RF_{IN}$), that is disregarding inversion of the FET Q1.

If the phase-shifting voltage $V_{PS1}$ is raised to 10.0 volts dc, and the phase-shifting voltage $V_{PS2}$ remains at 0.0 volts dc, 10.0 volts dc will be applied across the FET Q2, and 0.0 volts dc will be applied across the FETs Q1 and Q3. The FET Q2 will now be at maximum gain, while the FETs Q1 and Q3 will be at minimum gain. In this case, the rf output $RF_{OUT}$ will be at 90 degrees relative to the rf input signal $RF_{IN}$. Again, this disregards inversion of the FET Q2.

Similarly to FIG. 1, if the phase-shifting voltage $V_{PS1}$ is 5.0 volts dc, and the phase-shifting voltage $V_{PS2}$ is at 0.0 volts dc, the rf output ($RF_{OUT}$) will be at 45 degrees relative to the rf input signal ($RF_{IN}$). By proper application of the phase-shifting voltages, $V_{PS1}$ and $V_{PS2}$, the phase angle of the variable phase-shifting rf power amplifier 30 can be made to vary monotonically and reasonably linearly from 0 degrees to 180 degrees.

Referring again to FIGS. 2 and 3, as noted above, the variable phase-shifting rf power amplifier 30 includes both the phase splitting/combining rf power amplifier 32 of FIG. 2 and the phase control 34 of FIG. 3. The phase control 34 generates phase-shifting voltages $V_{PS1}$ and $V_{PS2}$ for use by the phase splitting/combining rf power amplifier 32. These phase-shifting voltages, $V_{PS1}$ and $V_{PS2}$, are generated in response to the phase-control voltages $V_{PC}$ that are adjustably, or selectably, applied to the phase control 34 of FIG. 3.

The phase control 34 of FIG. 3 includes amplifiers U1 and U2 which are rail-to-rail operational amplifiers. In addition, the phase control 34 includes resistors R2, R3, R4, and R5 that set the gain of the amplifiers, U1 and U2, and that set the voltage at which the amplifier U2 starts amplifying.

The amplifier U1 is biased to start amplifying at the phase-control voltage $V_{PC}$ of 0.0 volts, and the amplifier U2 is biased to start amplifying at the phase-control voltage $V_{PC}$ of 5.0 volts. In the schematic shown in FIG. 3, the resistors R2, R3, R4, and R5 all have the same resistances, which, for instance, may have resistances of 10 K ohms.

In response to the phase-control voltage $V_{PC}$ of 0.0 volts, the phase control 34 produces phase-shifting voltages $V_{PS1}$ and $V_{PS2}$ of 0.0 volts, dc. In response to increases in the phase-control voltage $V_{PC}$, the phase-shifting voltage $V_{PS1}$ increases to 5.0 volts while keeping the phase-shifting voltage $V_{PS2}$ at 0.0 volts dc. Phase-control voltages $V_{PC}$ of 0.0, 2.5, 5.0, 7.5, and 10.0 volts produce phase angles of 0, 45, 90, 135, and 180 degrees, respectively.

With further increases in the phase-control voltage $V_{PC}$, when the phase-shifting voltage $V_{PS1}$ reaches 10.0 volts dc, it remains at this level while the phase-shifting voltage $V_{PS2}$ increases from 0.0 volts to 10.0 volts dc.

Thus, it can be seen that by combining the phase control 34 with the phase splitting/combining rf power amplifier 32, the resultant variable phase-shifting rf power amplifier 30 can be phase shifted monotonically and reasonably linearly from 0 degrees to 180 degrees as the phase-control voltage $V_{PC}$ is increased.

Figure 5:
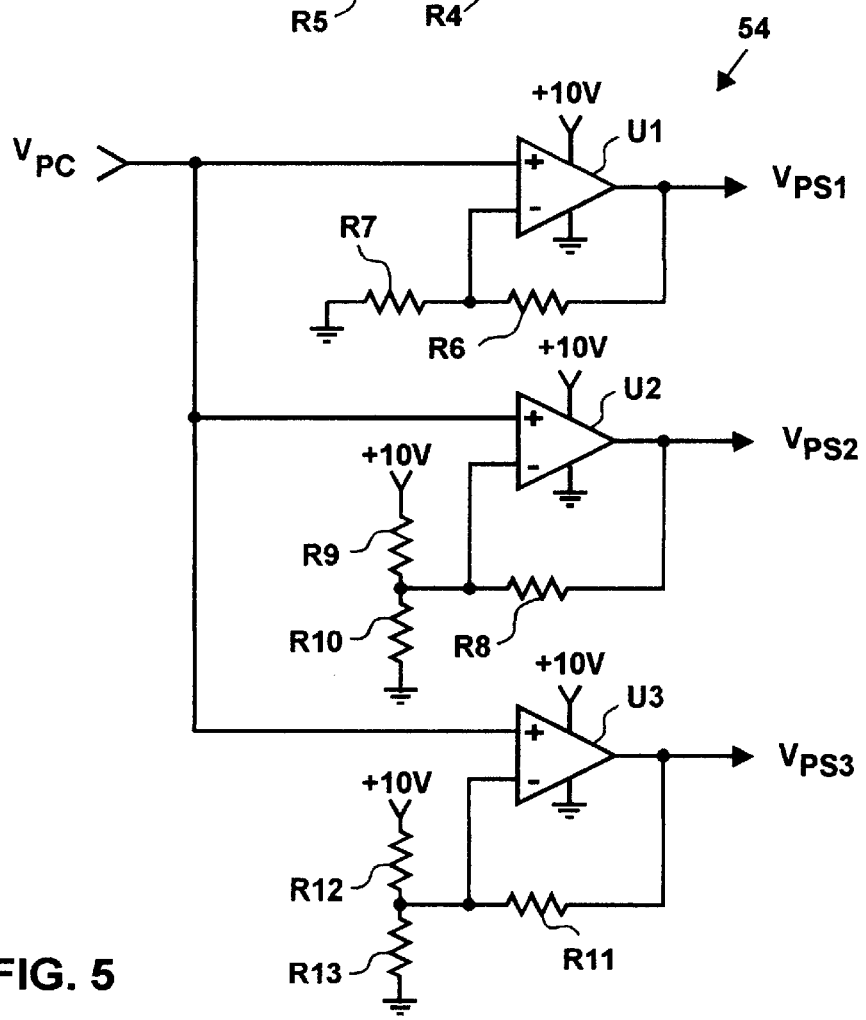
FIG. 5 is a phase control, that generates three phase-shifting voltages in response to a single phase-control voltage, and that when combined with the phase splitter/combiner rf power amplifier of FIG. 4, becomes a variable phase-shifting rf power amplifier in which the rf output can be phase shifted up to 270 degrees substantially linear with a single phase-control voltage.
Figure 4:
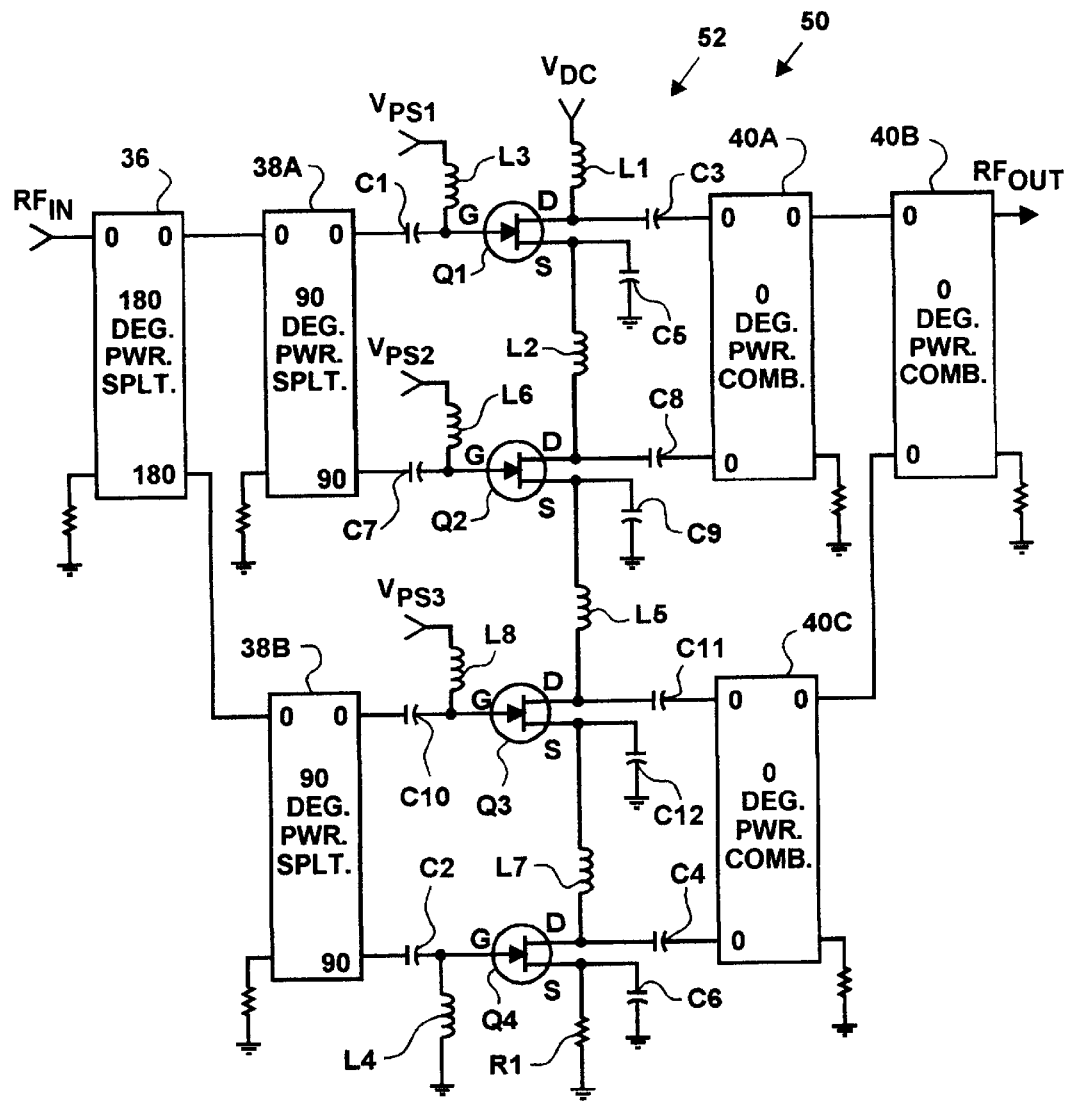
FIG. 4 is a phase splitting/combining rf power amplifier, in which four FETs are stacked to selectively utilize a source-voltage, that when combined with a phase control of FIG. 5, becomes a variable phase-shifting rf power amplifier in which a phase angle of an rf output can be shifted up to 270 degrees in response to three phase-shifting voltages.

Referring now to FIGS. 4 and 5, a variable phase-shifting rf power amplifier 50 includes both a phase splitting/combining rf power amplifier 52 of FIG. 4 that requires phase-shifting voltages $V_{PS1}$, $V_{PS2}$, and $V_{PS3}$, and a phase control 54 of FIG. 5 that generates the phase-shifting voltages $V_{PS1}$, $V_{PS2}$, and $V_{PS3}$ in response to the adjustable or selectable phase-control voltage $V_{PC}$. The variable phase-shifting rf power amplifier 50 has a phase-shift range of 270 degrees, as opposed to 180 degrees for the variable phase-shifting rf power amplifier 30 of FIGS. 2 and 3.

Referring now to FIG. 4, the phase splitting/combining rf power amplifier 52 includes the 180 degree power splitter 36, the 90 degree power splitter 38A, a 90 degree power splitter 38B, input terminals that accept phase-shifting voltages $V_{PS1}$, $V_{PS2}$, and $V_{PS3}$, solid-state amplifying devices, field-effect transistors, or FETs, Q1, Q2, Q3, and Q4, the 0 degree power combiners 40A and 40B, and an other 0 degree power combiner 40C.

As shown in FIG. 4, the 180 degree power splitter 36 phase splits the rf input $RF_{IN}$ into 0 and 180 degree phase-shifted rf signals, and the 90 degree power splitter 38A, which is connected to the 0 degree output of the 180 degree power splitter 36, splits its output into 0 and 90 degree rf signals, so that 0 and 90 degree phase-shifted rf signals are provided by the 90 degree power splitter 38A at 0 and 90 degree outputs, respectively; and a 180 degree phase-shifted rf signal is provided at the 180 degree output of the 180 degree power splitter 36.

Also, as shown in FIG. 4, the 180 degree output of the 180 degree power splitter 36 is connected to the input of the 90 degree power splitter 38B, so that the output at the 0 degree output of the 90 degree power splitter 38B is not shifted additionally, but remains at 180 degrees. However, the other rf output of the 90 degree power splitter 38B is phase-shifted an additional 90 degrees from that of the 180 degree output of the 180 degree power splitter 36, to 270 degrees.

Therefore, as can be understood from the schematic drawing of FIG. 4, the rf signal 17A of FIG. 10 that is not phase-shifted is provided by the 0 degree output of the 90 degree power splitter 38A, the rf signal 17B that is phase-shifted 90 degrees is provided at the 90 degree output of the 90 degree power splitter 38A, the rf signal 17C that is phase-shifted by 180 degrees is provided at the 0 degree output of the 90 degree power splitter 38B, and an rf signal 17D that is phase-shifted 270 degrees is provided at the 90 degree output of the 90 degree power splitter 38B.

The phase splitting/combining rf power amplifier 52 includes coupling capacitors, decoupling capacitors, and rf chokes as shown in FIGS. 1 and 2, and as named in conjunction therewith. In addition, the phase-splitting/combing rf power amplifier 52 includes coupling capacitors C10 and C11, decoupling capacitor C12, and rf chokes L7 and L8.

If phase-shifting voltages $V_{PS1}$, $V_{PS2}$, and $V_{PS3}$, are all at 0.0 volts dc, 10.0 volts dc will be applied across the FET Q1 and 0.0 volts dc will be applied across the FETs Q2, Q3, and Q4. Since the gain of the FETs, Q1, Q2, Q3, and Q4 is approximately a linear function of the applied voltage from drain to source, the FET Q1 will be at maximum gain while the FETs Q2, Q3, and Q4 will be at minimum gain. The rf output ($RF_{OUT}$) will then be at 0 degrees relative to the rf input signal ($RF_{IN}$), that is disregarding inversion of the FET Q1.

If the phase-shifting voltage $V_{PS1}$ is now raised to 10.0 volts dc and the phase-shifting voltages $V_{PS2}$ and $V_{PS3}$ remain at 0.0 volts dc, 10.0 volts dc will be applied across the FET Q2, and 0.0 volts dc will be applied across the FETs Q1, Q3, and Q4. The FET Q2 will now be at maximum gain while the FETs Q1, Q3, and Q4 will be at minimum gain. In this case, the rf output ($RF_{OUT}$) will be at 90 degrees relative to the rf input signal ($RF_{IN}$), again disregarding inversion of the FET Q2.

Similarly to FIG. 1, if the phase-shifting voltage $V_{PS1}$ is at 5.0 volts dc, and the phase-shifting voltages $V_{PS2}$ and $V_{PS3}$ are at 0.0 volts dc, the rf output ($RF_{OUT}$) will be at 45 degrees relative to the rf input signal ($RF_{IN}$). By proper application of the phase-shifting voltages $V_{PS1}$, $V_{PS2}$, and $V_{PS3}$, the phase of the phase-shifting rf power amplifier 50 can be made to vary monotonically and reasonably linearly from 0 degrees to 270 degrees.

These concepts can be extended to even wider phase control by applying the principles set forth in conjunction with FIG. 4. Optionally, the splitters and combiners can be at phase angles other than 0 degrees, 90 degrees, and 180 degrees.

Referring again to FIGS. 4 and 5, as noted above, the variable phase-shifting rf power amplifier 30 includes both the phase splitting/combining rf power amplifier 52 of FIG. 4 and the phase control 54 of FIG. 5. The phase control 54 generates phase-shifting voltages $V_{PS1}$, $V_{PS2}$, and $V_{PS3}$ for use by the phase splitting/combining rf power amplifier 52 in response to the phase-control voltage $V_{PC}$ that is adjustably or selectably applied to the phase control 54 of FIG. 5.

The phase control 54 of FIG. 5 includes amplifiers U1, U2, and U3 which are rail-to-rail operational amplifiers. In addition, the phase control 54 includes resistors R6, R7, R8, R9, R10, R11, R12, and R13 that set the gain of the amplifiers, U1, U2, and U3, to be 4.0. Resistances of the resistors R6, R7, R8, R9, R10, R11, R12, and R13, preferably are 30K, 10K, 30K, 30K, 15K, 30K, 15K and 30K, respectively, but all may be at resistances that are any reasonable multiple or fraction thereof.

The amplifiers, U1, U2, and U3, are biased to start amplifying at different phase-control voltages $V_{PC}$ of 0.0, 2.5, 5.0, and 7.5 volts by resistances as listed above; so that phase-control voltages $V_{PC}$ of 0.0, 2.5, 5.0, 7.5, and 10.0 volts produce phase angles of 0, 45, 90, 135, and 180 degrees, respectively.

More particularly, in response to the phase-control voltage $V_{PC}$ of 0.0 volts, the phase control 34 produces phase-shifting voltages, $V_{PS1}$, $V_{PS2}$, and $V_{PS3}$, of 0.0 volts, dc. In response to increases in the phase-control voltage $V_{PC}$, the phase-shifting voltage $V_{PS1}$ increases to 10.0 volts while keeping the phase-shifting voltage $V_{PS2}$ at 0.0 volts dc.

With further increases in the phase-control voltage $V_{PC}$, when the phase-shifting voltage $V_{PS1}$ reaches 10.0 volts dc, it remains at this level while the phase-shifting voltage $V_{PS2}$ increases from 0.0 volts to 10.0 volts dc. In like manner, after the phase-shifting voltages, $V_{PS1}$ and $V_{PS2}$, both reach 10.0 volts dc, they remain at 10.0 volts dc while additional increases in the phase-control voltage $V_{PC}$ increase the phase-shifting voltage $V_{PS3}$ from 0.0 to 10.0 volts dc.

Thus, combining the phase splitting/combining rf power amplifier 52 with the phase control 54 provides the variable phase-shifting rf power amplifier 50 in which the rf output can be phase shifted monotonically and reasonably linearly from 0 degrees to 270 degrees as the phase-control voltage $V_{PC}$ is increased.

Referring again to FIGS. 1, 2, and 4, as stated previously, the amplification function of the FETs, such as the FETs Q1 and Q2, is maintained by using rf chokes, such as the rf chokes L1, L2, L3, and L4, to keep the rf signal from getting onto the dc bias lines and to prevent rf interference between the series-connected FETs; and decoupling capacitors, such as the decoupling capacitors C5 and C6, are used to keep the sources of FETs at an rf ground.

The selection of the decoupling capacitors and rf chokes are both critical to the rf performance of the circuits, particularly for high-power rf amplifiers, although selection of decoupling capacitors is the most critical.

Decoupling capacitors, such as the decoupling capacitors C5, C6, C9, and C12 are selected for both resonant frequencies at or very near to the circuit operating frequency and the lowest possible effective (or equivalent) series resistances (ESRs).

The rf chokes, such as the rf chokes L1, L2, L3, L4, L5, L6, L7, and L8 preferably are inductors with self-resonant frequencies at or very near to the circuit operating frequency.

Figure 6:
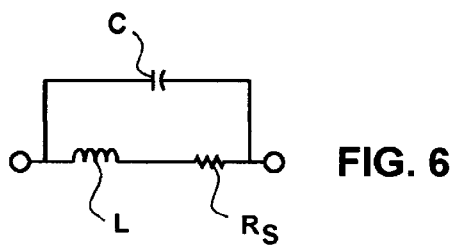
FIG. 6 is a model for simulating a microwave inductor.

Referring now to FIG. 6, the microwave circuit model of an inductor is a series resistor Rs and inductor L in parallel with a capacitor C. The resistor Rs represents the dc coil resistance along with the increased wire resistance at rf frequencies due to the skin effect (the effect of the current being concentrated nearer to the surface of the wire) as the operational frequency is increased. The capacitor C represents the distributed capacitance between the parallel windings of the coils. Inductance of the inductor L is the nominal component inductance.

At operation below the self-resonant frequency, the impedance of an inductor increases as frequency increases. At the inductor self-resonant frequency, the inductor, as represented by a parallel L/C circuit of FIG. 6, resonates as an open circuit creating a maximum impedance to the rf signal. At operation higher than the self-resonant frequency, the distributed capacitance of the capacitor C dominates the rf impedance resulting in the impedance decreasing with increasing frequency. The inductor self-resonant frequency is given as: $F_{SR}=1/[2\pi*\sqrt{(LC)}]$.

The resistance of the series resistor Rs limits the maximum impedance of the self-resonant inductor. That is, the quality factor (Q) of the inductor is the ratio of an inductor's reactance to its series resistance. High-Q inductors, with very low resistances, have very high self-resonant impedances, but for only a narrow bandwidth. Lower-Q inductors, with higher resistances, have lower self-resonant impedances for a much broader bandwidth.

This self-resonant feature is used in the circuit to prevent the rf signal from coupling onto the dc bias lines and to aide the decoupling capacitors in preventing rf crosstalk between the two, or more, FETs. For narrow-band operation, very high-Q inductors are desired to maximize series impedance. Quarter wave transformers may also be used for this function in narrow-band applications. For broad-band operation, lower-Q inductors are desired to obtain a high impedance across a larger bandwidth. In either application, the inductor must be capable of passing the maximum dc current without breakdown.

Utilizing the self-resonant characteristics of decoupling capacitors, such as the decoupling capacitors C5, C6, C9, and C12, is required to optimize rf performance while maximizing dc-rf conversion efficiency, particularly in applications where the rf power exceeds 100 milliWatts.

Figure 7:
FIG. 7 is model for simulating a microwave capacitor.

Referring now to FIG. 7, the microwave circuit model of a capacitor is an inductor L in series with a resistor Rs in series with a capacitor C. The inductor L represents the inductance of the leads and the capacitor plates. The resistor Rs represents the equivalent series resistance, or ESR, of the capacitor. Capacitor dielectric losses, metal plate losses, and skin effects all contribute to the ESR. The capacitor C is the nominal component capacitance.

These parasitic effects of a capacitor at microwave frequencies alter its impedance characteristics in the opposite manner as that of an inductor. At operation below the self-resonant frequency, a capacitor decreases in impedance as frequency increases. At the capacitor self-resonant frequency, a capacitor, as represented by a series L/C circuit of FIG. 7, resonates as a short circuit creating a minimum impedance to the rf signal. At frequencies higher than the self-resonant frequency, the lead and plate inductance L dominates the rf impedance resulting in the impedance increasing with increasing frequency. The capacitor self-resonant frequency equation is: $F_{SR}=1/[2\pi*\sqrt{(LC)}]$, which is the same as for the inductor.

The rf impedance of a capacitor at self-resonant frequency is equal to the ESR. As in the case of the inductor L, Q of a capacitor is the ratio of a capacitor's reactance to its ESR, or alternatively Q is 1/DF where DF is the dissipation factor of the capacitor. High-Q capacitors, with very low ESR, have very low self-resonant impedances, but for only a narrow bandwidth. Lower-Q capacitors, with higher ESR, have lower self-resonant impedances for a much broader bandwidth. Presently, the preferred capacitor dielectric to minimize capacitor ESR is porcelain. Porcelain has a dissipation factor (DF) of 0.00007, the lowest of all currently available capacitor dielectrics.

To minimize the rf impedance from the FET source terminal to a circuit ground, decoupling capacitors with self-resonant frequencies at or very near to the amplifier operational frequency are required in higher rf power applications.

The power dissipated in the decoupling capacitor is $P_{DISS}=I^2*ESR$, where I is the root-mean-square, or rms, of the rf current through the capacitor. Alternatively, $P_{DISS}=P_{RF}*ESR/Z$ where Z is the circuit load impedance, typically 50 ohms, and $P_{RF}$ is the rf output power of the FET.

For optimal performance, the ratio of FET rf output power $P_{RF}$, to decoupling capacitor power dissipated $P_{DISS}$, should be no less than 2000 for medium rf power, which is defined as 100 milliWatts to 2.0 Watts FET rf output power. For high-power rf applications, which is defined as FET output power greater than 2.0 Watts, the $P_{RF}/P_{DISS}$ ratio should be no less than 5000.

Very high-Q decoupling capacitors are necessary to minimize series impedance to a circuit ground, whether it be for narrow-band, or wide-band operation. For broad-band operation, multiple high-Q decoupling capacitors with self-resonant frequencies selected at several points in the operating frequency band are optimally selected for minimum ESR across a broad frequency band.

Figure 8:
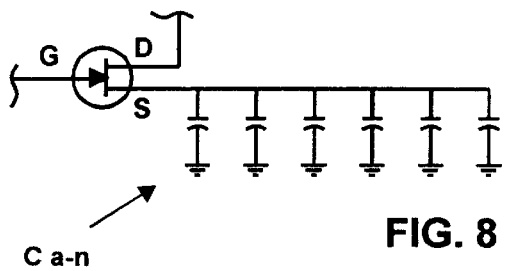
FIG. 8 shows the use of multiple decoupling capacitors to minimize the equivalent series resistance (ESR) of the decoupling capacitors.

Referring now to FIG. 8, two or more multiple porcelain dielectric capacitors, each with self-resonant frequencies at or near the amplifier operational frequency, are connected in parallel from the FET source terminal to a circuit ground to achieve the low required decoupling capacitor ESR for high power rf applications.

Paralleling a plurality of capacitors at the self-resonant frequency divides the ESR in the same manner as paralleling resistors. However, if a capacitor is not available with a resonant frequency that closely matches an operating frequency for narrow-band operation, two paralleled capacitors are chosen with one having a resonant frequency above the narrow-band frequency, and the other having a resonant frequency below the narrow-band frequency.

Referring now to FIGS. 1, 2, and 4, preferably the effective series resistances of the decoupling capacitors C5, C6, C9, and/or C12 each have an effective series resistance of less than 0.4 ohms divided by the rf output power. More preferably, all of these decoupling capacitors have an effective series resistance of 0.20 ohms divided by the rf output power.

If the required ESR, as calculated by either of the formulas given above, for any or all of the decoupling capacitors C5, C6, C9, and/or C12 cannot be met by a single capacitor, any or all may be replaced by any number of paralleled capacitors Ca-n, as shown in FIG. 8.

Porcelain capacitors presently have the lowest dielectric resistance and are preferred for minimizing the effective rf impedance. Porcelain capacitors, model 600S, manufactured by *American Technical Ceramics* of Huntington Station, N.Y., are suitable for rf decoupling as taught herein.

Model 600S capacitors that are available from American Technical Ceramics, their self resonant frequencies, their capacities, and their effective series resistances, are included in the following table.

TABLE 1

Porcelain Capacitors
Self Resonant Frequencies vs. ESRs

| Self Resonant Freq. | Capacitance | ESR |
|---|---|---|
| 1 Ghz | 100 pF | 0.07 ohms |
| 2 Ghz | 40 pF | 0.09 ohms |
| 4 Ghz | 15 pF | 0.15 ohms |
| 8 Ghz | 3 pF | 0.20 ohms |
| 16 Ghz | 1 pF | 0.30 ohms |

Referring now to FIG. 8 and Table 1, as an example of capacitor paralleling to achieve a required ESR, assume an rf output of 5.0 Watts, using the 0.2 ohms/Watts criteria, the ESR of the decoupling capacitor should be 0.04 ohms. Assuming an operating frequency of 4.0 Ghz, from Table 1, the ESR for a porcelain capacitor is 0.15 ohms, so four capacitors must be paralleled to achieve the required ESR.

Packaged FETs typically have a considerable source lead parasitic inductance. By choosing a decoupling capacitor, or capacitors, with a value that resonates with the source lead inductance, the true FET source impedance to a circuit ground is further reduced.

Therefore, the package, or lead, inductance of the capacitor, or capacitors, should be considered in the equation for resonance when selecting a capacitor to resonate with the FET source lead inductance. Additionally, several parallel capacitors with a combined reactance that resonates with the FET source lead inductance are selected to minimize the decoupling capacitor ESR and maximize efficiency in high-power rf applications (FET rf output in excess of 2.0 Watts).

Often in high-power packaged FETs the source terminal is the body of the device and is connected to a mounting flange. Conventionally, the flange is connected directly to a circuit ground with metallic screws to achieve minimal rf impedance to an electrical ground and to maximize thermal conductivity between the FET and a circuit ground, which is most often a chassis serving as a heat sink to the FET. However, in the present invention, the source terminals of the FETs are electrically isolated from a circuit ground.

Figure 9:
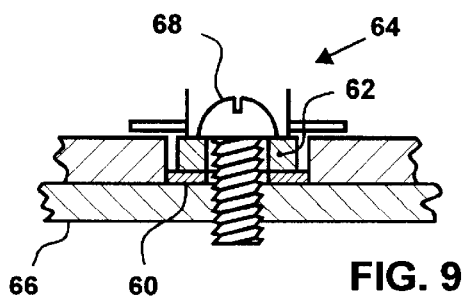
FIG. 9 is a side elevation, in partial cross section, of a high-power rf FET that is mounted to achieve maximum thermal conduction while maintaining electrical isolation of the source-terminal from an electrical ground.

Referring now to FIG. 9, a thermally conductive, electrically insulating pad 60 is inserted between a FET mounting flange 62 of a FET 64 and a heat sink, or chassis, 66 to allow the dissipated heat of the FET 64 to flow from the FET 64 to the heat sink 66 while maintaining electrical isolation. The electrical insulating material of the pad 60 should have no higher than 0.5° C./Watt thermal resistance. An insulating material with a higher thermal resistance, combined with the thermal resistance of the FET and the ambient temperature, may result in the internal junction temperature of the FET being excessive, thereby causing reduced reliability or destruction of the FET.

A suitable material for the insulating material is *DeltaPad Thermally Conductive Insulator,* Part Number 174-9 Series, manufactured by Wakefield Engineering of Pelham, N.H. The material for the insulating pad 60 is 0.22 millimeters (0.009 inches) thick, has a thermal resistance of 0.25° C./W, a resistivity of $10^{13}$ megohms per cubic centimeter of volume, and a 5000 volt breakdown.

The mounting flange 62 is held in heat-conducting contact with the insulating pad 60 and with the heat sink 66, with non-ferrous, or non-conductive, screws 68. The tensile strength and stretching of the screw material along with the manufacturer-recommended FET mounting torque must be taken into account when selecting fasteners.

Although the preceding discussion has focused on use of FETs, bipolar silicon transistors, and other solid-state amplifying devices may be used. However, FETs are preferred because of their high gain, thereby reducing the total number of amplification stages that are required to achieve the desired rf power output. Therefore, it should be understood that the principles taught herein may be applied to other types of solid-state amplifying devices.

In summary, the present invention can be characterized as phase splitting an rf input into rf signals that are at different phase angles, selectively amplifying one and an other of the rf signals, and combining the rf signals subsequent to the amplifying step.

The present invention can be characterized as phase splitting an rf input into rf signals that are at different phase angles, amplifying the rf signals at selective proportions, and combining the rf signals subsequent to the amplifying step.

The present invention can be characterized as applying a voltage across two FETs that are connected in series, and selectively utilizing the voltage in one or an other of the FETs.

The present invention also can be characterized as applying a voltage across two FETs that are connected in series, and selectively proportioning the voltage between the FETs.

The present invention can be characterized as phase-shifting an rf output up to 180, 270, or more, degrees without the rf output decreasing to zero, or even changing the rf output appreciably.

Finally, the present invention can be characterized as providing optimum rf decoupling, especially by reducing the effective series resistance (ESR) of decoupling capacitors, thereby removing power limitations from rf power amplifiers in which solid-state amplifying devices, such as FETs, are connected in series between a source-voltage and a lower-voltage.

While specific apparatus and method have been disclosed in the preceding description, it should be understood that these specifics have been given for the purpose of disclosing the principles of the present invention, and that many variations thereof will become apparent to those who are versed in the art. Therefore, the scope of the present invention is to be determined by claims included herein without any limitation by numbers that may be parenthetically inserted in the claims.

What is claimed is:

1. A method for phase-shifting an rf output which comprises:
   a) phase-splitting an rf input into a plurality of rf signals that are at different phase angles;
   b) amplifying a selected one of said rf signals;
   c) simultaneously amplifying an other of said rf signals;
   d) inversely controlling gains of said amplifying steps; and
   e) combining said rf signals into said rf output subsequent to said amplifying steps.

2. A method as claimed in claim 1 in which said inversely controlling step comprises variably biasing a solid-state amplifying device.

3. A method as claimed in claim 1 in which:
   a) said amplifying steps comprise connecting a plurality of solid-state amplifying devices in series between a dc source voltage and a lower voltage; and
   b) said inversely controlling step comprises utilizing a difference in said voltages in inverse percentages in said solid-state amplifying devices.

4. A method for phase-shifting an rf output which comprises:
   a) splitting an rf input into first and second rf signals that are at different phase angles;
   b) inputting said first rf signal into a first solid-state amplifying device;
   c) inputting said second rf signal into a second solid-state amplifying device;
   d) amplifying said first and second rf signals with selective and individually different gains; and
   e) combining said rf signals subsequent to said amplifying step.

5. A method as claimed in claim 4 in which said step of amplifying with selective and different gains comprises selectively biasing one of said solid-state amplifying devices.

6. A method as claimed in claim 4 in which:
   a) said method further comprises connecting said solid-state amplifying devices in series between a dc source voltage and a lower voltage; and
   b) said step of amplifying with selective and different gains comprises proportionally dividing a difference between said voltages in said solid-state amplifying devices.

7. A method for binary-phase-shift-key modulating which comprises:
   a) splitting an rf output into 0, 90, and 180 degree rf signals;
   b) separately amplifying said rf signals to be different, one from an other;
   c) combining said separately amplified rf signals into a single rf output;
   d) phase shifting said single rf output as a function of said separately-amplified rf signals; and
   e) preventing said single rf output from decreasing to 0 degrees when said rf output is phase-shifted 180 degrees.

8. A method as claimed in claim 1 in which said inverse controlling of said gains comprises inversely controlling said gains as a function of a single, variable, phase-control voltage.

9. A method as claimed in claim 1 in which:
   a) said amplifying steps comprise connecting a lower-voltage terminal of a first solid-state amplifying device to an rf choke, and connecting said rf choke to a higher-voltage terminal of a second solid-state amplifying device; and
   b) said inversely controlling step comprises maintaining a voltage difference substantially constant between a higher-voltage terminal of said first solid-state amplifying device and a lower-voltage terminal of said second solid-state amplifying device, irrespective of said inverse controlling step.

10. A method as claimed in claim 1 in which said method further comprises maintaining said rf output substantially constant irrespective of said inverse controlling of said gains.

11. A method as claimed in claim 1 in which:
    a) said amplifying steps comprise connecting a lower-voltage terminal of a first solid-state amplifying device to an rf choke, and connecting said rf choke to a higher-voltage terminal of a second solid-state amplifying device; and
    b) said inversely controlling step comprises utilizing a voltage difference between a higher-voltage terminal of said first solid-state amplifying device and a lower-voltage terminal of said second solid-state amplifying device in selected percentages.

12. A method as claimed in claim 1 in which:
    a) said inverse controlling of said gains comprises inversely controlling said gains as a function of a single, variable, phase-control voltage; and
    b) said phase-shifting of said rf output comprises phase-shifting said rf output to angles that are a substantially linear function of said single, variable, phase-control voltage.

13. A method as claimed in claim 1 in which:
    a) said amplifying steps comprise connecting a lower-voltage terminal of a first solid-state amplifying device to an rf choke, and connecting said rf choke to a higher-voltage terminal of a second solid-state amplifying device;
    b) said inversely controlling step comprises utilizing a voltage difference between a higher-voltage terminal of said first solid-state amplifying device and a lower-voltage terminal of said second solid-state amplifying device in selected percentages;
    c) said utilizing step comprises variably biasing one of said solid-state amplifying devices; and
    d) said phase-shifting of said rf output comprises phase-shifting said rf output to angles that are a substantially linear function of voltage variations of said variable biasing step.

14. A method as claimed in claim 7 in which said preventing step further comprises maintaining said rf output substantially constant irrespective of said 180 degree phase-shifting.

15. A method as claimed in claim 7 in which said method further comprises accomplishing said 180 degree phase-shifting step in response to a single phase-control voltage.

16. A method as claimed in claim 7 in which:
    a) said method further comprises accomplishing said 180 degree phase-shifting step in response to a single phase-control voltage; and
    b) said method still further comprises making said phase-shifting substantially linear to changes in said single phase-control voltage.

17. A method as claimed in claim 7 in which:
    a) said method further comprises accomplishing said 180 degree phase-shifting step in response to a single phase-control voltage;
    b) said method still further comprises making said phase-shifting substantially linear to changes in said single phase-control voltage; and
    c) said method still further comprises maintaining said rf output substantially constant irrespective of said 180 degree phase-shifting.

18. A method as claimed in claim 7 in which:
    a) said separate amplifying steps comprise connecting three solid-state amplifying devices in dc series;
    b) said binary-phase-shift-key modulating comprises utilizing a dc voltage in selected percentages in said solid-state amplifying devices; and
    c) said method still further comprises maintaining said rf output substantially constant irrespective of said selected percentages.

19. A method as claimed in claim 7 in which:
    a) said amplifying steps comprise connecting three solid-state amplifying devices in dc series;
    b) said separate amplifying steps further comprise utilizing a dc voltage in selected percentages in said solid-state amplifying devices;

c) said utilizing step comprises variably biasing two of said solid-state amplifying devices;

d) said variable biasing step comprises using a single phase-control voltage; and e) said variable biasing step comprises making a phase angle change of said rf output substantially linear with said single phase-control voltage.

20. A method as claimed in claim 7 in which:

a) said separate amplifying steps comprise connecting a plurality of solid-state amplifying devices in dc series;

b) said binary-phase-shift-key modulating comprises utilizing a difference in a dc voltage in selected percentages in various ones of said solid-state amplifying devices; and c) said utilizing step comprises making a phase angle of said rf output a substantially linear function of a single phase-control voltage.

21. A method as claimed in claim 7 in which:

a) said separate amplifying steps comprise connecting a plurality of solid-state amplifying devices in dc series;

b) said binary-phase-shift-key modulating comprises utilizing a difference in a dc voltage in selected percentages in various ones of said solid-state amplifying devices;

c) said utilizing step comprises making a phase angle of said rf output a substantially linear function of a single phase-control voltage; and d) said method still further comprises maintaining said rf output substantially constant irrespective of said selected percentages.

22. A method which comprises:

a) phase-splitting an rf input into a plurality of rf signals whose phase angles encompass first and second phase angles;

b) separately and simultaneously amplifying said rf signals;

c) selectively proportioning gains of said amplifying steps to be different, one from an other;

d) combining said separately and simultaneously amplified rf signals into a single rf output; and e) phase-shifting said rf output to selected phase angles between said first and second phase angles as a function of said selective proportioning step.

23. A method as claimed in claim 22 in which said selective proportioning step comprises controlling one of said gains as a function of a variable phase-control voltage.

24. A method as claimed in claim 22 in which said selective proportioning step comprises controlling said gains as different functions of a single, variable, phase-control voltage.

25. A method as claimed in claim 22 in which said method further comprises maintaining said rf output of said combining step substantially constant.

26. A method as claimed in claim 22 in which:

a) said method further comprises maintaining said rf output of said combining step substantially constant;

b) said maintaining step comprises said selective proportioning of said gains; and c) said selective proportioning of said gains comprises making one of said gains a function of a variable phase-control voltage.

27. A method as claimed in claim 22 in which:

a) said method further comprises maintaining said rf output of said combining step substantially constant;

b) said maintaining step comprises said selective proportioning of said gains; and c) said selective proportioning of said gains comprises making both of said gains a function of a single, variable, phase-control voltage.

28. A method as claimed in claim 22 in which said separate amplifying steps comprise connecting a plurality of solid-state amplifying devices in dc series.

29. A method as claimed in claim 22 in which:

a) said separate amplifying steps comprise connecting a plurality of solid-state amplifying devices in dc series; and b) said phase-shifting step comprises utilizing a difference in a dc voltage in selected percentages in various ones of said solid-state amplifying devices.

30. A method as claimed in claim 22 in which:

a) said separate amplifying steps comprise connecting a plurality of solid-state amplifying devices in series between a dc source voltage and a lower voltage;

b) said phase-shifting step comprises utilizing a difference in said voltages in selected percentages in various ones of said solid-state amplifying devices; and c) said utilizing step comprises controlling a gain of one of said solid-state amplifying devices as a function of a variable phase-control voltage.

31. A method as claimed in claim 22 in which:

a) said separate amplifying steps comprise connecting a plurality of solid-state amplifying devices in series between a dc source voltage and a lower voltage;

b) said phase-shifting step comprises utilizing a difference in said voltages in selected percentages in various ones of said solid-state amplifying devices; and c) said utilizing step comprises controlling gains of all of said solid-state amplifying devices as a function of a single, variable, phase-control voltage.

32. A method as claimed in claim 22 in which:

a) said separate amplifying steps comprise connecting a plurality of solid-state amplifying devices in series between a dc source voltage and a lower voltage;

b) said phase-shifting step comprises utilizing a difference in said voltages in selected percentages in various ones of said solid-state amplifying devices;

c) said utilizing step comprises controlling gains of all of said solid-state amplifying devices as a function of a single, variable, phase-control voltage; and d) said method further comprises phase-shifting said rf output as a substantially linear function of said single, variable, phase-control voltage.

33. A method as claimed in claim 22 in which:

a) said separate amplifying steps comprise connecting a plurality of solid-state amplifying devices in dc series; and b) said method further comprises phase-shifting said rf output as a substantially linear function of a single, variable, phase-control voltage.

34. A method as claimed in claim 22 in which:

a) said separate amplifying steps comprise connecting a plurality of solid-state amplifying devices in dc series; and b) said method further comprises maintaining said rf output substantially constant irrespective of said phase-shifting step.

35. A method as claimed in claim 22 in which:

a) said separate amplifying steps comprise connecting a plurality of solid-state amplifying devices in dc series;

b) said method further comprises phase-shifting said rf output as a substantially linear function of a single, variable, phase-control voltage; and c) said method further comprises maintaining said rf output substantially constant irrespective of said phase-shifting step.

* * * * *

UNITED STATES PATENT AND TRADEMARK OFFICE
CERTIFICATE OF CORRECTION

PATENT NO. : 6,690,238 B2  Page 1 of 1
APPLICATION NO. : 10/091056
DATED : February 10, 2004
INVENTOR(S) : Lloyd L. Lautzenhiser and Barry A. Lautzenhiser It is certified that error appears in the above-identified patent and that said Letters Patent is hereby corrected as shown below:

Column 4, Line 34, insert --individually-- between "and" and "different"; Line 39, insert --to be different, one from an other-- between "signals" and "combining"; Line 40, insert --phase-shift-ing the single rf output as a function of the separately-amplified rf signals;-- between "output;" and "and"; Lines 43-59, delete; Line 60, delete "fifth", insert --fourth--; and Line 65, insert --to be different, one from an other-- between "steps" and "combining".

Signed and Sealed this

Twelfth Day of May, 2009

JOHN DOLL
*Acting Director of the United States Patent and Trademark Office*